United States Patent
Sharma (10) Patent No.: US 7,710,164 B1
(45) Date of Patent: May 4, 2010

(54) HIGHLY LINEAR BOOTSTRAPPED SWITCH WITH IMPROVED RELIABILITY

(75) Inventor: Bhupendra Sharma, Bangalore (IN)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/141,099

(22) Filed: Jun. 18, 2008

Related U.S. Application Data (60) Provisional application No. 60/944,794, filed on Jun. 18, 2007.

(51) Int. Cl.
*G11C 27/02* (2006.01)

(52) U.S. Cl. .................. 327/94; 327/390

(58) Field of Classification Search .......... 327/90–96, 327/390, 589
See application file for complete search history.

(56) References Cited

U.S. PATENT DOCUMENTS

| | | | | |
|---|---|---|---|---|
| 6,052,000 A * | 4/2000 | Nagaraj | | 327/94 |
| 6,118,326 A * | 9/2000 | Singer et al. | | 327/390 |
| 6,215,348 B1 * | 4/2001 | Steensgaard-Madsen | | 327/390 |
| 6,249,154 B1 * | 6/2001 | Jouffre et al. | | 327/91 |
| 6,956,411 B1 * | 10/2005 | Holloway | | 327/94 |
| 6,977,544 B2 * | 12/2005 | Nicollini et al. | | 327/589 |
| 7,183,814 B2 * | 2/2007 | Kudo | | 327/91 |
| 7,253,675 B2 * | 8/2007 | Aksin et al. | | 327/390 |
| 7,274,222 B2 * | 9/2007 | Alacoque et al. | | 327/94 |
| 7,397,284 B1 * | 7/2008 | Liu | | 326/88 |
| 7,492,207 B2 * | 2/2009 | Cornelissens et al. | | 327/365 |
| 2005/0258874 A1 * | 11/2005 | Kudo | | 327/91 |

* cited by examiner

*Primary Examiner*—Lincoln Donovan
*Assistant Examiner*—Thomas J Hiltunen
(74) *Attorney, Agent, or Firm*—Townsend and Townsend and Crew LLP (57) ABSTRACT

Circuits, methods, and apparatus that provide bootstrapped switches having improved reliability. One example improves the reliability of a discharge transistor connected to discharge the gate of a switch transistor by decreasing its operating voltage during the discharge. This example provides a discharge transistor having a first source-drain region connected to a gate of a switch transistor. Since the gate of the switch transistor can reach high voltages, if the discharge transistor's second source-drain region is instantaneously tied to ground when the switch's gate is discharged, the discharge transistor's reliability can be degraded due to hot-electron effects. Accordingly, instead of being connected to ground—or an intermediate node that quickly reaches the ground potential during gate discharge—the second source-drain region of the discharge transistor is coupled to an intermediate node that discharges to ground at a slower rate.

16 Claims, 9 Drawing Sheets

HIGHLY LINEAR BOOTSTRAPPED SWITCH WITH IMPROVED RELIABILITY

CROSS-REFERENCES TO RELATED APPLICATIONS

This application claims the benefit of U.S. provisional patent application No. 60/944,794, titled HIGHLY LINEAR BOOTSTRAPPED SWITCH WITH IMPROVED RELIABILITY, by Sharma, filed Jun. 18, 2007, and is related to U.S. patent application Ser. No. 12/141,100, now U.S. Pat. No. 7,671,776, titled INPUT SAMPLING NETWORK THAT AVOIDS UNDESIRED TRANSIENT VOLTAGES, by Rangan et al., filed Jun. 18, 2008, which are incorporated by reference.

BACKGROUND

Switches are a useful building block that finds applications in many types of integrated circuits. When combined with a capacitor to form a switched capacitor they can be used to provide a circuit having resistive electrical characteristics. Common uses for switched capacitors include switched capacitor filters, integrators, sigma-delta modulators for analog-to-digital and digital-to-analog converters, and others.

Switched capacitors are efficiently implemented using MOSFET transistors. In fact, switched capacitor circuits have become much more popular with the increasing use of MOSFETs in analog and mixed signal applications.

Switches formed using one device typically have a first source-drain region connected to the input, a second source-drain region connected to the output, and a gate that is selectively tied to one of two voltage levels, for example, it may be grounded or connected to a supply voltage. In this configuration, the gate-to-source voltage of the transistor forming the switch is dependent on the input voltage. When the switch is an n-channel transistor and is conducting, the gate-to-source voltage decreases with increasing input voltage.

This change in gate-to-source voltage changes the series resistance of the switch, that is, the resistance of the switch is dependent on the input voltage begin switched. This nonlinearity can limit circuit performance in many applications. Accordingly, bootstrapped switches are used, where the gate voltage for the switch increases with input voltage such that the switch's gate-to-source voltage is maintained.

This configuration requires that a transistor used to discharge the switch's gate voltage to ground sustain a very high drain-to-source voltage. This can create hot-electron problems, which can reduce the discharging transistor's lifetime. For example, hot carriers can be injected into a gate of a transistor thereby changing the transistor's threshold voltage over time.

Accordingly, what is needed are circuits, methods, and apparatus that provide bootstrapped switches having improved reliability.

SUMMARY

Accordingly, embodiments of the present invention provide circuits, methods, and apparatus for bootstrapped switches having improved reliability. An exemplary embodiment provides a bootstrapped switch having a capacitor that is charged to a voltage such as VCC. When the switch is on, one terminal of the capacitor is connected to an input voltage and the other terminal is connected to the bootstrapped switch's gate. In this way, when it is on, the VGS of the bootstrapped switch is VCC, independent of the input voltage. When turned off, the gate of the bootstrapped switch is discharged by a discharge transistor.

An exemplary embodiment of the present invention reduces the hot-electron problem of this discharge transistor. This embodiment increases reliability of the discharge transistor by decreasing its operating voltage during the discharge.

One exemplary embodiment of the present invention provides a discharge transistor having a first source-drain region connected to the gate of the switch transistor. Since the gate of the switch transistor can reach high voltages, if the discharge transistor's second source-drain region is instantaneously tied to ground when the switch's gate is discharged, the discharge transistor's reliability can be degraded due to hot-electron effects. Accordingly, instead of being connected to ground or an intermediate node that quickly reaches the ground potential during gate discharge, the second source-drain region of the discharge transistor is coupled to an intermediate node that discharges to ground at a slower rate. In one example, the intermediate node is a node of the capacitor that is coupled to VIN during device operation. In this way, when the discharge transistor begins discharging, it sees a drain-to-source voltage equal to the supply voltage.

A specific embodiment of the present invention includes a boost capacitor having a first node that alternately is coupled to receive the input voltage and ground, and a second node that is alternately coupled to the gate of the switch transistor and a positive supply voltage. A first source-drain region of a discharge transistor is also connected to the gate of the switch transistor, while the second source-drain region of the discharge transistor is connected to the first node of the boost capacitor. In this way, the discharge transistor is protected from excessive voltages during the discharge of the switch's gate.

Various embodiments of the present invention may incorporate one or more of these or the other features described herein. A better understanding of the nature and advantages of the present invention may be gained with reference to the following detailed description and the accompanying drawings.

DESCRIPTION OF EXEMPLARY EMBODIMENT

Figure 1:
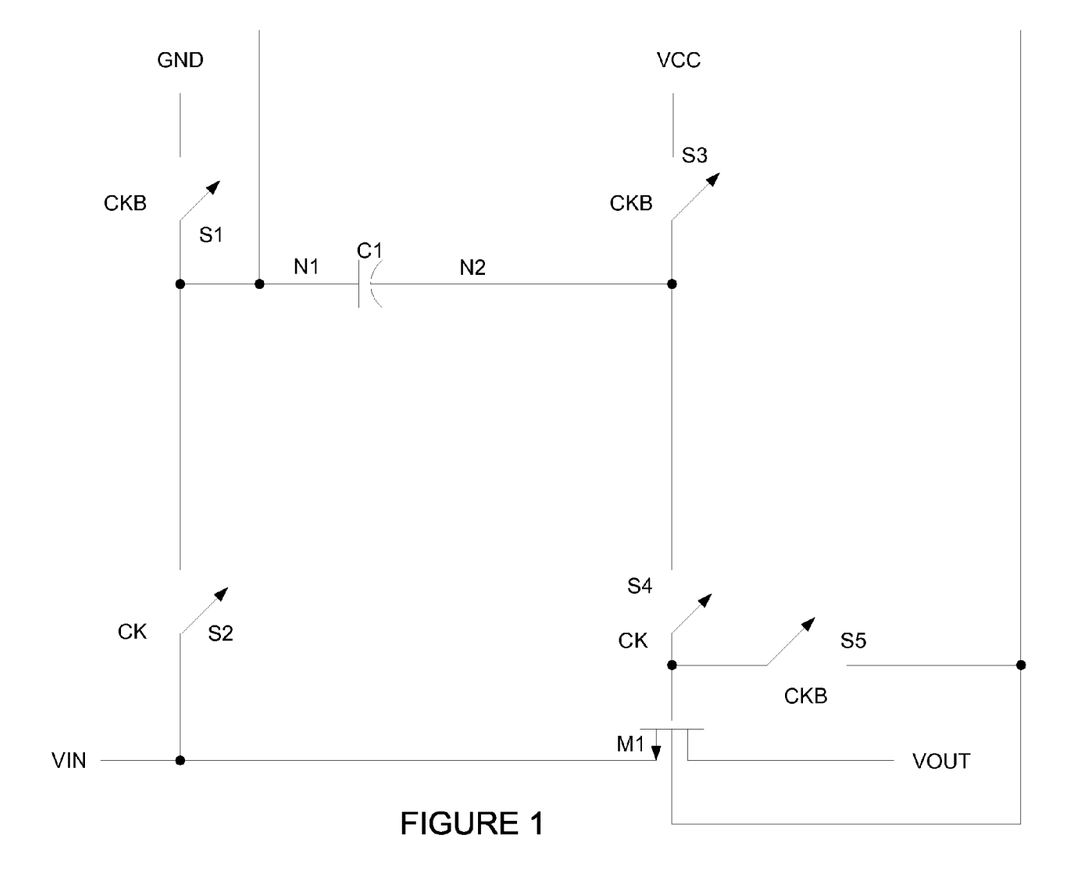
FIG. 1 is a simplified schematic of a bootstrapped switch according to an embodiment of the present invention.

FIG. 1 is a simplified schematic of a bootstrapped switch according to an embodiment of the present invention. This switch is also known by other various names, such as a charge boost switch or charge pump. This figure includes a number of switches including S1, S2, S3, S4, and S5, a charge boost capacitor C1, and bootstrapped switch M1. The switches S2 and S4 are closed when the clock signal CK is high, and switches S1, S3, and S5 are closed when the clock bar signal CKB is high. This boost switch may be used in a sampling circuit coupled to an integrator, for example, an integrator that is part of a sigma-delta modulator. One example can be found in U.S. patent application Ser. No. 12/141,031, titled INPUT SAMPLING NETWORK THAT AVOIDS UNDESIRED TRANSIENT VOLTAGES, by Rangan et al., filed Jun. 18, 2008, which is incorporated by reference.

When conducting, the switch M1 couples the input VIN to the output VOUT. When nonconducting, the switch M1 provides a high impedance between the input VIN and the output VOUT.

Typically, the gate of a switch transistor such as M1 is driven between supply voltages, such as VCC and ground, which are the power supplies for this exemplary circuit. When the gate of M1 is connected to VCC, the input and output are through the series-on resistance of M1. As the input voltage VIN increases, the gate-to-source voltage of transistor M1 decreases, thereby increasing the series-on resistance. This increase in resistance can result in nonlinearities and other errors. Accordingly, the boost capacitor C1 is used to increase the voltage at the gate of M1, such that the gate-to-source voltage of transistor M1 is equal to VCC, regardless of the magnitude of the input voltage.

Figure 2A:
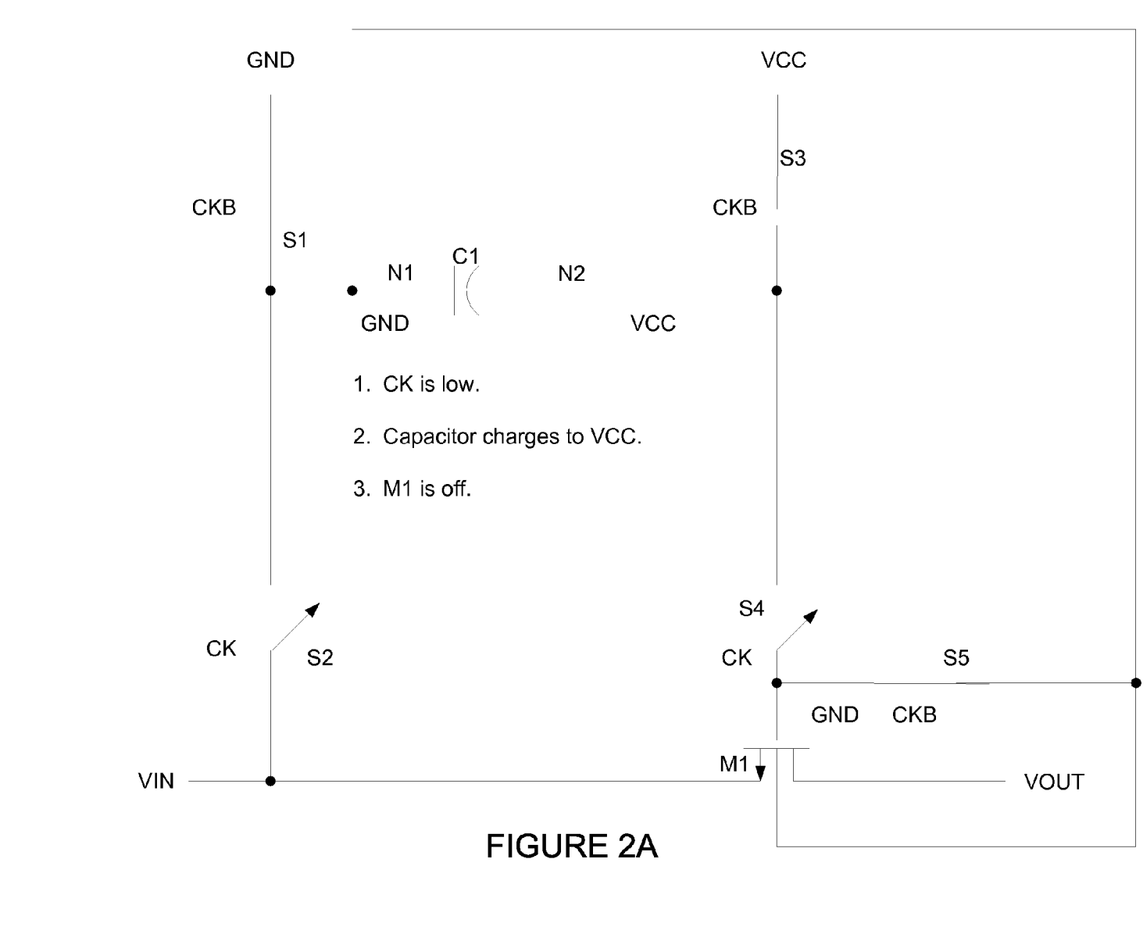
FIGS. 2A and 2B illustrate the operation of the circuitry in FIG. 1.

As shown in FIG. 2A, when CKB is high and CK is low, switches S1, S3, and S5 are closed. In this case, capacitor C1 is connected between ground and VCC, while the gate of transistor M1 is connected to ground, thereby shutting off the switch.

Figure 2B:
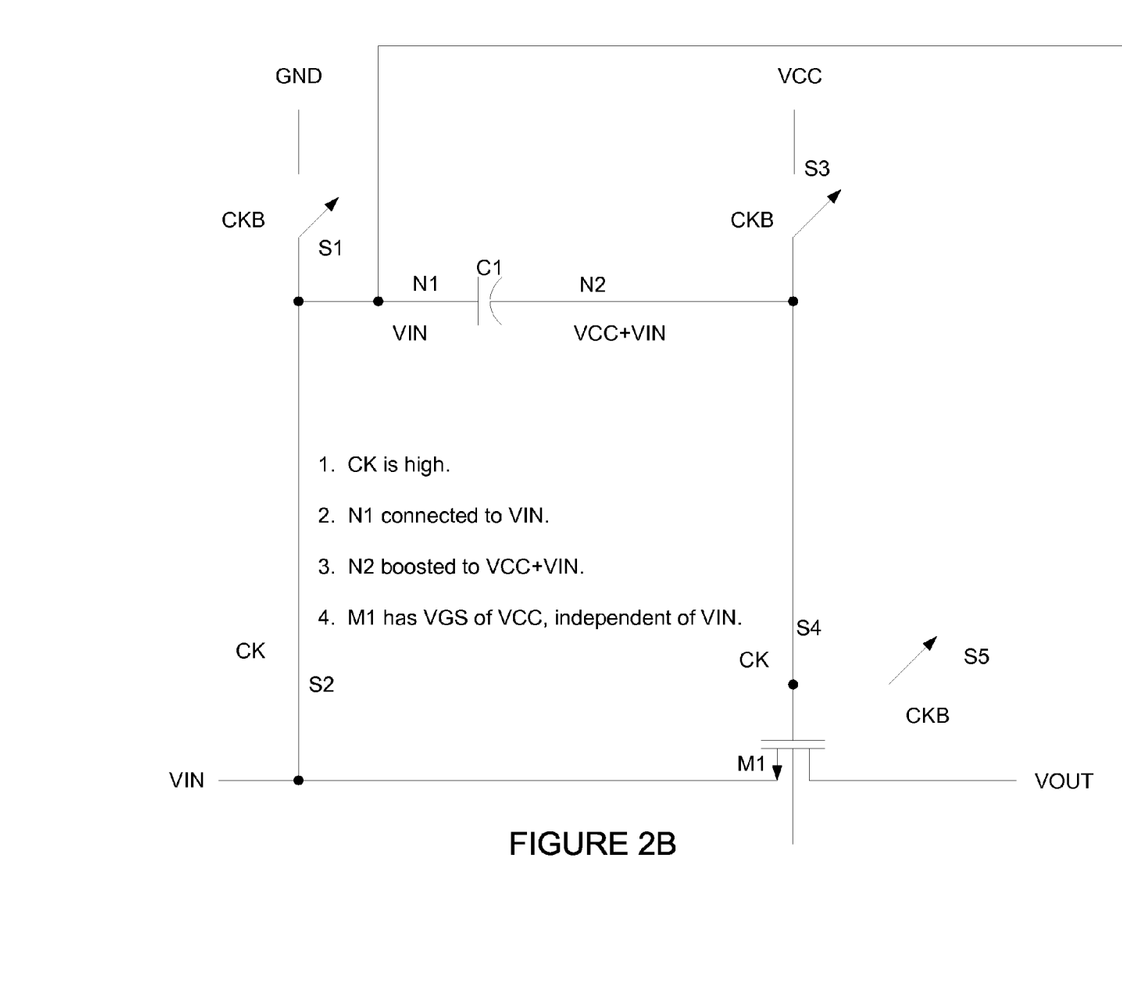

As shown in FIG. 2B, when CK goes high and CKB goes low, switches S2 and S4 are closed. In this configuration, capacitor C1 is connected between the input VIN and the gate of transistor M1. When these switches close, the voltage across capacitor C1 cannot change instantaneously. Accordingly, node N1 is equal to the input voltage, while node N2 is equal to the input voltage VIN plus VCC. At this time, the gate-to-source voltage of transistor M1 is equal to VCC, regardless of the magnitude of VIN, and switch M1 conducts, thereby coupling the output VOUT to the input VIN.

When the clock signal CK returns low, switch S5 closes, thereby discharging the gate of transistor M1 from VIN plus VCC to ground. If switch S5 were instead implemented as a discharge transistor connected to ground, the discharge transistor would have a drain voltage equal to VIN plus VCC, a source voltage equal to ground, and a gate voltage tied to a high voltage, for example, VCC. In a specific embodiment of the present invention, VCC can be 5V, and VIN can be as high as 4 V. Accordingly, the discharge transistor in such a circuit would have a drain voltage of 9 V, a gate voltage equal to 5 V, and a source voltage equal to ground. When these voltages are applied, hot electrons from the drain can damage the drain-to-gate interface of the transistor, leading to leakage and thereby reducing the reliability and lifetime of the discharge transistor. Accordingly, embodiments of the present invention provide a discharge switch that is protected from such voltages. This is explained further in the following figure.

Figure 3:
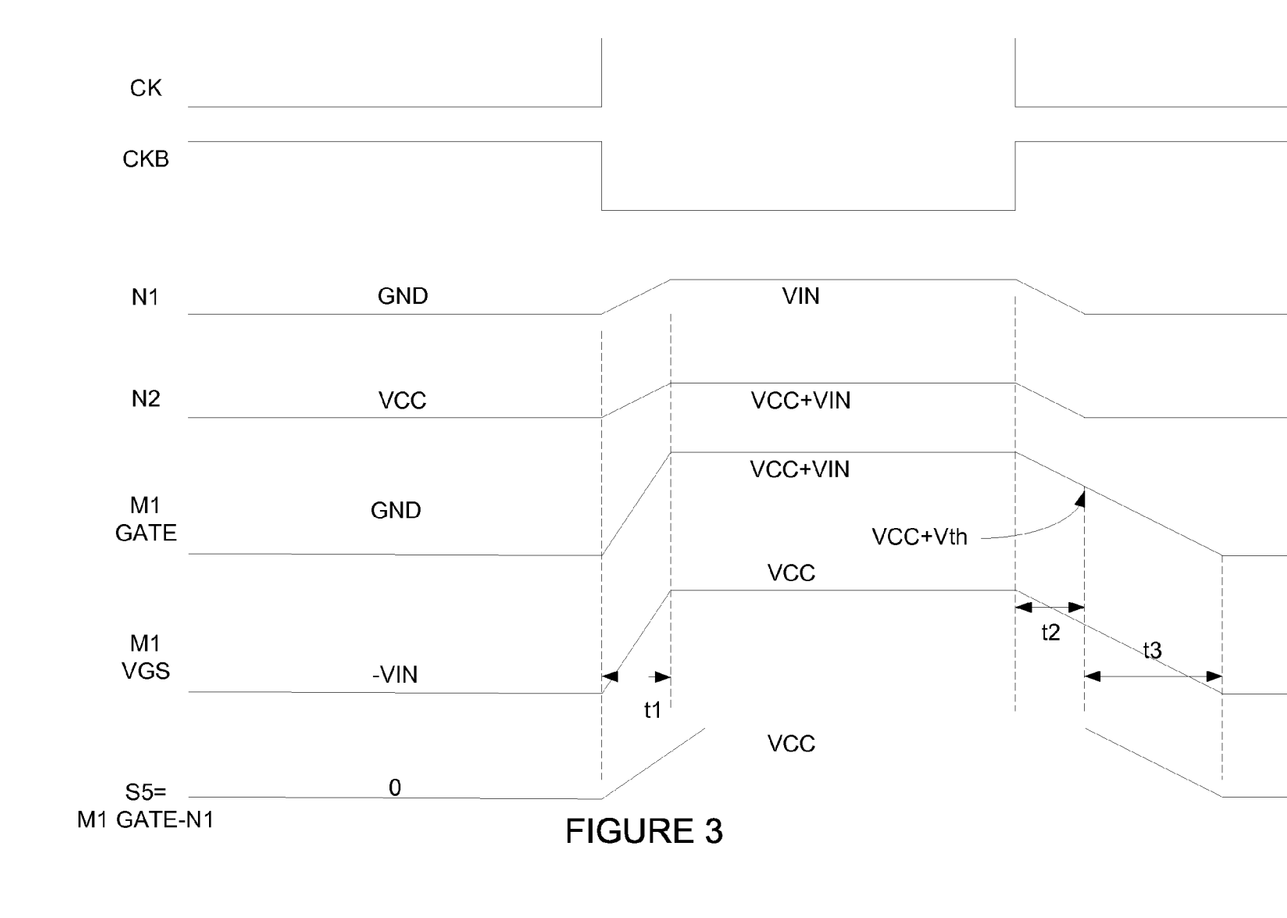
FIG. 3 is a timing diagram illustrating the operation of the circuitry shown in FIG. 1.

FIG. 3 is a timing diagram illustrating the operation of the circuitry shown in FIG. 1. It will be appreciated by one skilled in the art that these waveforms are highly simplified for exemplary purposes. When CK is low and CKB is high, the nodes of the capacitor N1 and N2 are connected to ground and VCC, respectively. The gate of the bootstrap switch transistor M1 is at ground, while its source is at VIN. Accordingly, the VGS of M1 is equal to negative VIN. At this time, the voltage across switch S5, the boost transistor gate discharge switch, is equal to the gate voltage of M1 minus the voltage at node N1, or zero.

When the clock signal CK is high, CKB is low, and node N1 of the capacitor is connected to VIN. Again, since the voltage across the capacitor C1 does not change instantaneously, node N2 is equal to VCC plus VIN. This voltage is applied to the gate of transistor M1. Accordingly, the VGS of transistor M1 is equal to VCC plus VIN minus VIN, which is equal to VCC. At this time, the voltage across switch S5 is equal to the gate voltage of M1 minus the voltage at node N1, or VCC plus VIN minus VIN, which is equal to VCC.

When CK returns low and CKB is high, switch S5 closes to discharge the gate of transistor M1. In a specific embodiment of the present invention, switch S4 is implemented using a p-channel MOSFET transistor. To shut switch S4 off, its gate is set to VCC. However, both of its source-drain regions are near VCC plus VIN. Accordingly, at least initially, S4 remains on and conducting. Specifically, S4 remains conducting until its source-drain regions are discharged below VCC plus a threshold voltage for the p-channel MOSFET. Thus, for a period of time after CK returns low, both S4 and S5 are closed, thereby connecting S5 across the terminals of the capacitor C. In this way, the voltage across S5 is held to VCC and the conditions that could result in hot-electron problems such as those described above are avoided. As the voltages on the source-drain regions of S4 approach VCC, S4 shuts off. S5 then continues to discharge the gate of M1 to ground through S1.

Specifically, as CK returns low, nodes N1 and N2 discharge during time t2. During this time, S4 remains closed and the gate of M1 is connected to and discharges along with node N2. Once the voltage at node N2 and the gate of M1 reaches a threshold voltage above VCC, S4 turns off and opens. After this, node N1 continues to discharge through S1 and the gate of M1 discharges through S5 and S1. The voltage across S5 decreases during time t3, thus completing the discharge of the gate of M1.

Figure 4:
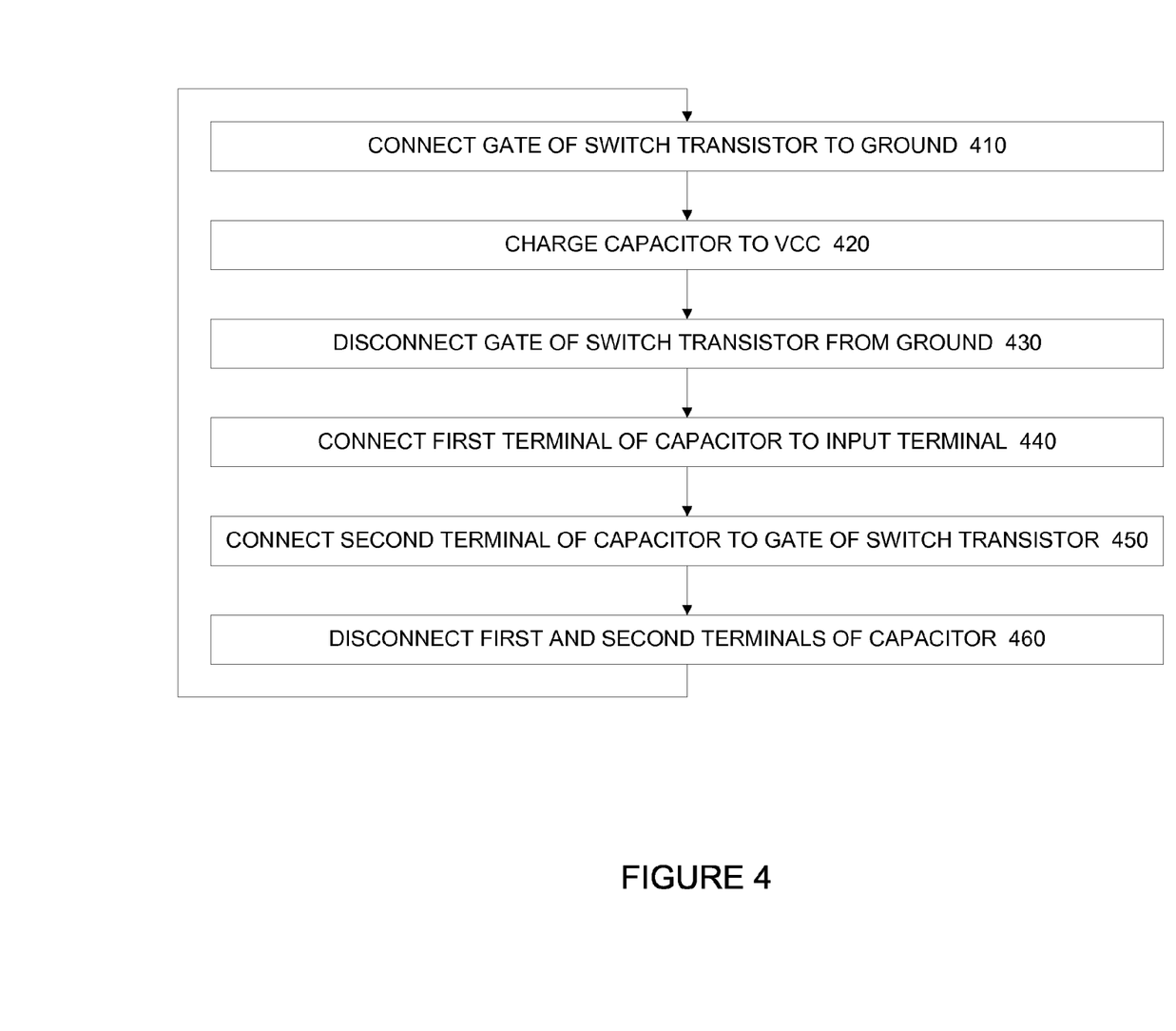
FIG. 4 is a flowchart illustrating the operation of the circuitry shown in FIG. 1.

FIG. 4 is a flowchart illustrating the operation of the circuitry shown in FIG. 1. In act 410, the gate of a bootstrap switch transistor is connected to ground. In act 420, a bootstrap capacitor is charged to VCC. In act 430, the gate of the bootstrap switch transistor is disconnected from ground. A first terminal the capacitor is connected to an input terminal in act 440. A second terminal of the capacitor is connected to the gate of the bootstrap switch transistor in act 450. At this time, the bootstrap switch transistor is conducting, and the output is connected to the input. In act 460, the first and second terminals of the capacitor are disconnected.

Figure 5:
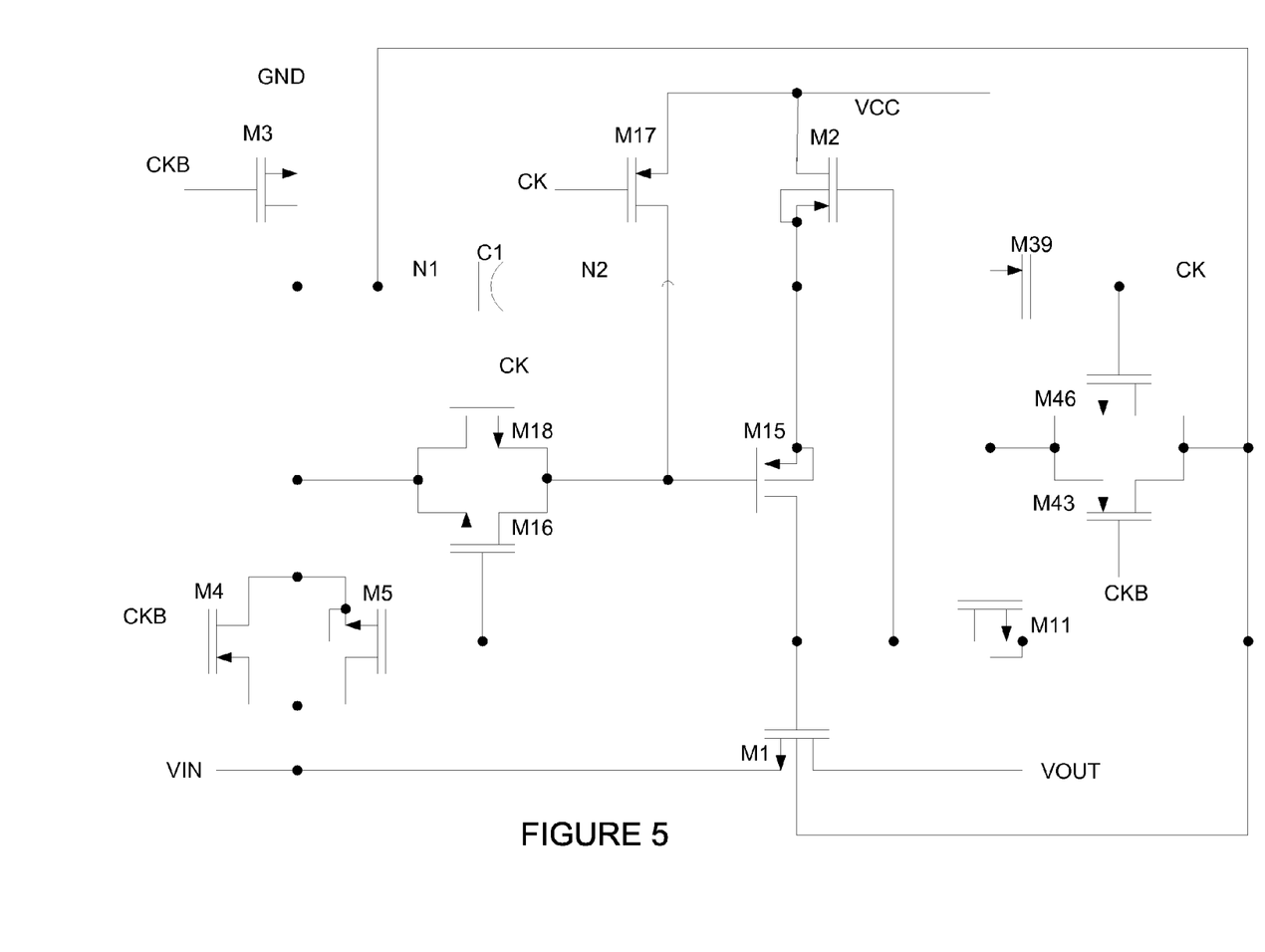
FIG. 5 is a schematic of an exemplary embodiment of the present invention.

FIG. 5 is a schematic of an exemplary embodiment of the present invention. Switch S5 is implemented here as discharge transistor M11. The source of M11 is not connected directly to ground, rather it is connected to node N1, which is discharged to ground via transistor M3. In this way, the excessive voltage at the gate of switch transistor M1 is divided between transistors M11 and M3, such that neither device is degraded by hot-electron effects. The operation of this circuit is shown in the following figures. In this and the following figures, bulk or body connections are shown for some devices while bulk or body connections for other devices have been omitted for clarity. Omitted bulk or body connections may be made to the sources of the individual devices, n-channel devices may have the connection made to ground, p-channel devices may have the connection made to VCC, and other connections may be made depending on the exact circuit implementation and process used.

Figure 6A:
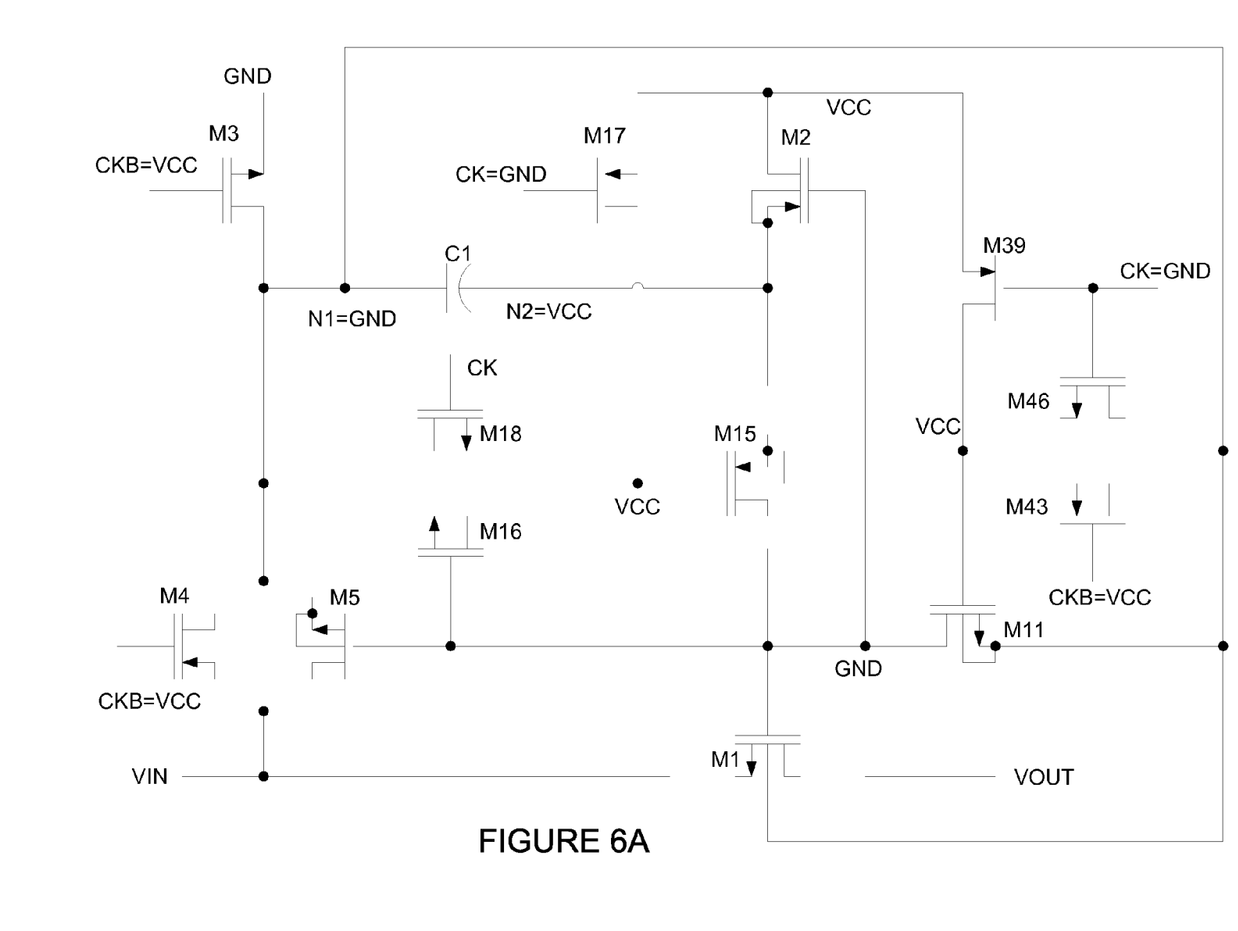
FIG. 6A illustrates the operation of an exemplary embodiment of the present invention when the clock signal CK is low.

FIG. 6A illustrates the operation of an exemplary embodiment of the present invention when the clock signal CK is low and the clock bar signal CKB is high. In this condition, switch transistor M1 is off and provides an open circuit between the input VIN and the output VOUT. Each off transistor is indicated by a break in the lines at the source-drain regions, for example, the source-drain regions of transistor M1. Each on transistor does not have a break in the lines to its source-drain regions.

At this time, capacitor C1 is connected through transistors M3 and M2 to ground and VCC. Accordingly, the boost capacitor C1 is charged to a potential of VCC. The discharge transistor M11 is on, thereby connecting the gate of the switch transistor M1 to ground via transistor M3. The gate of the discharge transistor M11 is connected through transistor M39 to VCC.

Figure 6B:
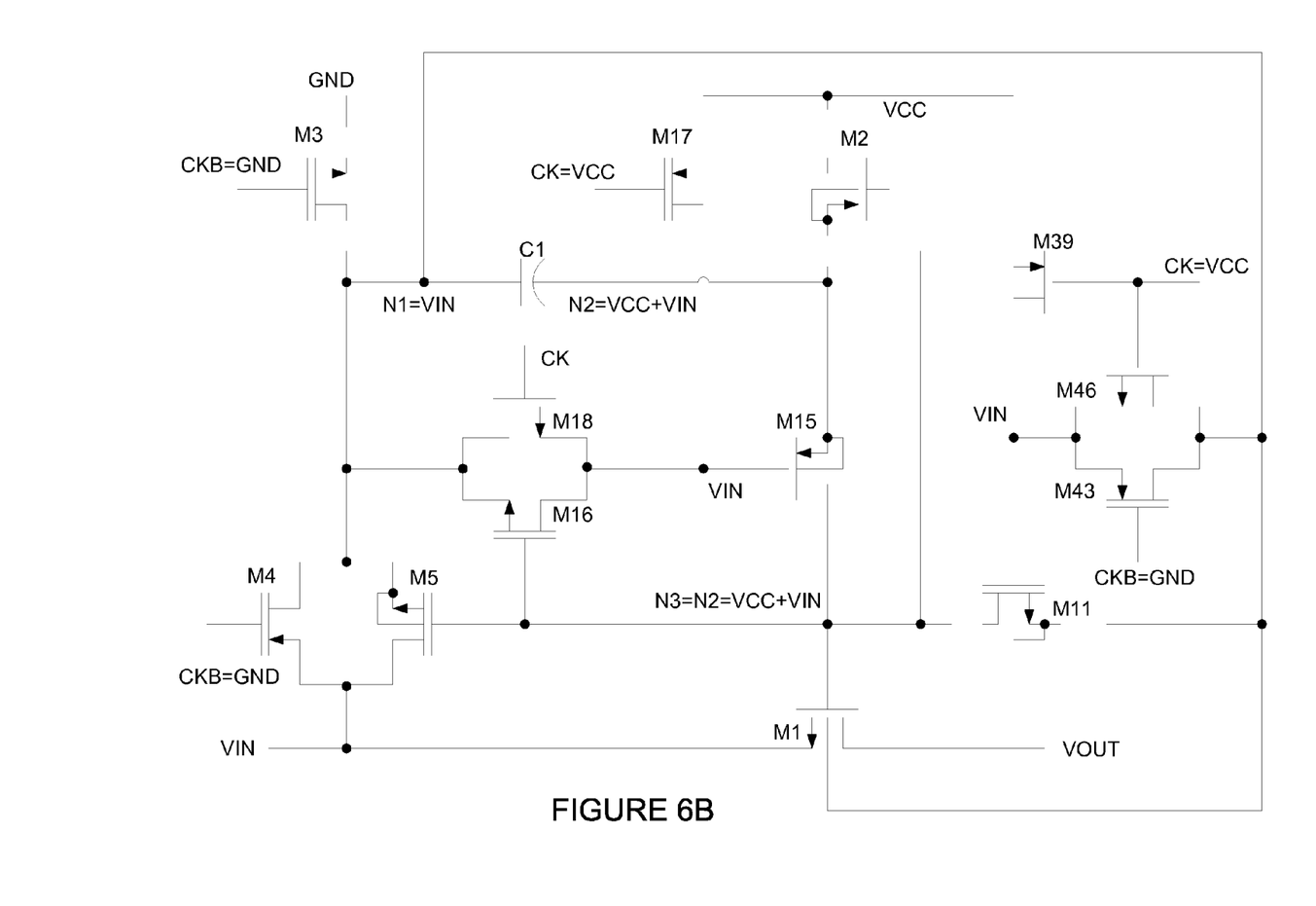
FIG. 6B illustrates the operation of this exemplary embodiment of the present invention when the clock signal CK is high.

FIG. 6B illustrates the operation of this exemplary embodiment of the present invention when the clock signal CK is high and a clock bar signal CKB is low. At this point, the boost capacitor C1 is connected between VIN and the gate of the switch transistor M1 via transistors M4, M5, and M15. Accordingly, the voltage at the gate of transistor M1 is equal to VIN plus VCC. The source of transistor M11 is connected to its gate through transistors M43 and M46. In this way, though the drain voltage of the discharge transistor M11 is high, gate-to-source voltage is zero, thus limiting hot-electron damage. Specifically, at this time, the gate and source voltage are both at the input voltage. In this way, the VDS of M1 is not greater than VCC.

When the clock signal CK returns low and CKB goes high, transistor M11 turns on and begins to conduct. However, its source does not discharge to ground instantaneously, as transistor M3 is loaded by the capacitor C1 and the source-drain regions of transistors M16 and M18, M4 and M5, and M43 and M46. Accordingly, the voltage at node N1 discharges to ground relatively slowly and prevents large voltages from the appearing across the discharge transistor M11. Also, initially during discharge, M15 remains on such that M11 is connected across the capacitor C1, which has a voltage of VCC. This causes the voltage at the gate of M1 to decrease at the same or similar rate as node N1. Once M15 turns off, M11 continues discharging the gate of M1 to ground through M3. In this way, hot electron effects are limited and the reliability of transistor M11, and of the bootstrap switch circuit itself, is improved.

The switches M1 are shown in this figure as n-channel devices, though in other embodiments of the present invention they may be p-channel devices. Alternately, they may be other types of transistors, such as bipolar or transistors developed using other process technologies. Similarly, the other transistors may vary in type and processing in other embodiments of the present invention.

Bootstrap switches provided by embodiments of the present invention may be used in many applications such as switched capacitor filters, integrators, sigma-delta modulators, and others. One example is shown in the following figure.

Figure 7:
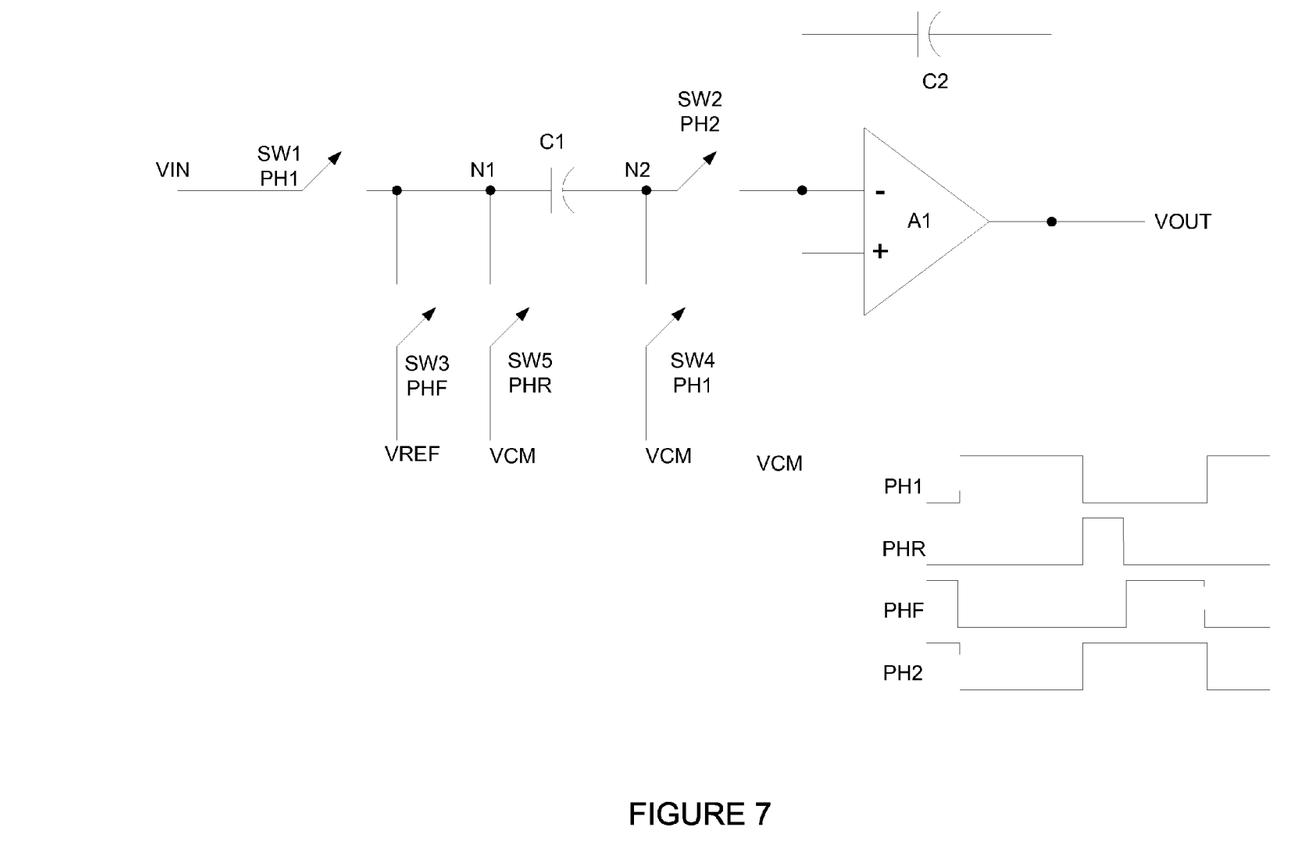
FIG. 7 is a schematic of a sampling network that may be improved by the incorporation of embodiments of the present invention.

FIG. 7 is a schematic of a sampling network that may be improved by the incorporation of embodiments of the present invention. This sampling network includes a switch SW5 that provides an intermediate transition in the charge coupling from capacitor C1 to C2 such that excessive voltages do not result at node N2. Embodiments of the present invention may be used to implement one or more of the switches in this figure, for example, SW1. Further details can be found in co-pending U.S. patent application Ser. No. 12/141,031, titled INPUT SAMPLING NETWORK THAT AVOIDS UNDESIRED TRANSIENT VOLTAGES, by Rangan et al., filed Jun. 18, 2008, which is incorporated by reference.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
   a first transistor used as a switch and having a first terminal coupled to receive an input voltage, a gate, and a second terminal coupled to provide an output voltage when the first transistor is conducting and a high impedance when the first transistor is nonconducting;
   a second transistor coupled between the gate of the first transistor and a first node,
   wherein when the first transistor is conducting, the second transistor is nonconducting and the first node and a gate of the second transistor are coupled to the input voltage, and
   wherein when the first transistor is nonconducting, the second transistor is conducing and the gate of the first transistor and the first node are coupled to a first voltage; and
   a capacitor having a first terminal and a second terminal,
   wherein when the first transistor is conducting, the second terminal of the capacitor provides a voltage approximately equal to a second voltage plus the input voltage to the gate of the first transistor.

2. The integrated circuit of claim 1 wherein the first voltage is ground.

3. The integrated circuit of claim 2 wherein the second voltage is a power supply voltage for the integrated circuit.

4. The integrated circuit of claim 1 wherein the first node is directly connected to the first terminal of the capacitor.

5. An integrated circuit including a switch transistor and further comprising:
   a capacitor having a first node and a second node;
   a first switch coupled between a first supply and the first node of the capacitor;
   a second switch coupled between an input terminal and the first node of the capacitor;
   a third switch coupled between a second supply and the second node of the capacitor;
   a fourth switch coupled between a gate of the switch transistor and the second node of the capacitor; and
   a fifth switch coupled between a gate of the switch transistor and the first node of the capacitor,
   wherein when the second and fourth switches are open, the first, third, and fifth switches are closed.

6. The integrated circuit of claim 5 wherein when the second and fourth switches are closed, the first, third, and fifth switches are open.

7. The integrated circuit of claim 5 wherein the first supply is ground.

8. The integrated circuit of claim 5 wherein the first supply is ground and the second supply is a power supply voltage for the integrated circuit.

9. The integrated circuit of claim 5 wherein the first switch is an n-channel MOSFET transistor.

10. The integrated circuit of claim 5 wherein the first and fifth switches are n-channel MOSFET transistors.

11. A method of driving a switch transistor comprising:
charging a capacitor to a first supply voltage; then
connecting a first terminal of the capacitor to an input voltage; while
connecting a second terminal of the capacitor to a gate of the switch transistor; then
disconnecting the first terminal of the capacitor from the input voltage; and
disconnecting the second terminal of the capacitor from the gate of the switch transistor; while
connecting the gate of the switch transistor to the first node of the capacitor; and
connecting the first node of the capacitor to a second supply voltage.

12. The method of claim 11 wherein the second supply voltage is ground.

13. The method of claim 11 wherein the first supply voltage is a power supply voltage and the second supply voltage is ground.

14. The method of claim 13 wherein connecting the gate of the switch transistor to the first node of the capacitor comprises turning on a transistor coupled between the gate of the switch transistor and the first node of the capacitor.

15. The method of claim 13 wherein connecting the gate of the switch transistor to the first node of the capacitor comprises turning on a first transistor coupled between the gate of the switch transistor and the first node of the capacitor, and connecting the first node of the capacitor to a second supply voltage comprises turning on a second transistor coupled between the first node of the capacitor and the second supply voltage.

16. The method of claim 15 wherein the first and second transistors are n-channel MOSFET transistors.

* * * * *